(12) United States Patent
Seidl

(10) Patent No.: US 11,602,067 B2
(45) Date of Patent: Mar. 7, 2023

(54) BACKPLANE AND METHOD FOR PRODUCING SAME

(71) Applicant: Siemens Aktiengesellschaft, Munich (DE)

(72) Inventor: Joachim Seidl, Sulzbach-Rosenberg (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 0 days.

(21) Appl. No.: 17/047,791

(22) PCT Filed: Apr. 15, 2019

(86) PCT No.: PCT/EP2019/059615
§ 371 (c)(1),
(2) Date: Oct. 15, 2020

(87) PCT Pub. No.: WO2019/206700
PCT Pub. Date: Oct. 31, 2019

(65) Prior Publication Data
US 2021/0168962 A1 Jun. 3, 2021

(30) Foreign Application Priority Data
Apr. 25, 2018 (EP) ..................... 18169231

(51) Int. Cl.
*H05K 1/18* (2006.01)
*H05K 7/14* (2006.01)
(Continued)

(52) U.S. Cl.
CPC ........... *H05K 7/1458* (2013.01); *H02B 1/015* (2013.01); *H05K 1/0209* (2013.01);
(Continued)

(58) Field of Classification Search
CPC ......... H05K 1/181–185; H05K 1/0209; H05K 1/0219; H05K 7/1458; H05K 2201/10083; H02B 1/105
See application file for complete search history.

(56) References Cited

U.S. PATENT DOCUMENTS

| 2005/0087356 | A1* | 4/2005 | Forcier | ................. | H05K 1/186 |
| | | | | | 174/558 |
| 2009/0290318 | A1* | 11/2009 | Takahashi | ............ | H05K 3/4694 |
| | | | | | 361/792 |
| 2010/0128460 | A1 | 5/2010 | Yang et al. | | |
| 2010/0200277 | A1 | 8/2010 | Huang et al. | | |

(Continued)

FOREIGN PATENT DOCUMENTS

| CN | 101686611 A | 3/2010 |
| CN | 101740245 A | 6/2010 |

(Continued)

OTHER PUBLICATIONS

PCT International Search Report dated Jul. 10, 2019 corresponding to PCT International Application No. PCT/EP2019/059615 filed Apr. 15, 2019.

(Continued)

*Primary Examiner* — Hoa C Nguyen
(74) *Attorney, Agent, or Firm* — Harness, Dickey & Pierce, P.L.C.

(57) ABSTRACT

A backplane is for electrically connecting electrical components and a method is for producing a backplane. The backplane includes a base board, conducting tracks arranged on and/or in the base board, and at least one actuator unit arranged on or in the base board.

13 Claims, 8 Drawing Sheets

(51) Int. Cl.
*H02B 1/015* (2006.01)
*H05K 1/02* (2006.01)
*H05K 3/46* (2006.01)

(52) U.S. Cl.
CPC ........... *H05K 1/0219* (2013.01); *H05K 1/183* (2013.01); *H05K 1/185* (2013.01); *H05K 3/4664* (2013.01); *H05K 2201/10083* (2013.01)

(56) References Cited

U.S. PATENT DOCUMENTS

| | | | |
|---|---|---|---|
| 2011/0088936 A1 | 4/2011 | Schaaf et al. | |
| 2012/0182066 A1* | 7/2012 | Merkle | H05K 1/185 327/564 |
| 2012/0195548 A1 | 8/2012 | Brunner et al. | |
| 2014/0001583 A1* | 1/2014 | Teh | B81B 3/0005 257/417 |
| 2014/0160704 A1 | 6/2014 | Janssen et al. | |
| 2014/0165378 A1 | 6/2014 | Mann et al. | |
| 2015/0189797 A1* | 7/2015 | Oster | B81C 1/0023 361/679.55 |
| 2018/0317328 A1 | 11/2018 | Fenker | |
| 2019/0062150 A1* | 2/2019 | Moitzi | B81B 7/0029 |

FOREIGN PATENT DOCUMENTS

| | | | |
|---|---|---|---|
| CN | 101982025 | A | 2/2011 |
| CN | 103327741 | A | 9/2013 |
| CN | 103782665 | A | 5/2014 |
| CN | 204560022 | U | 8/2015 |
| DE | 102008027761 | A1 | 11/2009 |
| DE | 10 2016 002 052 | A1 | 6/2017 |
| DE | 10 2016 217 236 | A1 | 3/2018 |
| EP | 0 643 451 | A2 | 3/1995 |
| EP | 1 311 146 | A2 | 5/2003 |
| EP | 1 553 630 | A1 | 7/2005 |
| EP | 2 916 393 | A1 | 9/2015 |
| JP | H10321987 | A | 12/1998 |
| WO | WO 2015000197 | A1 | 1/2015 |

OTHER PUBLICATIONS

Written Opinion of International Searching Authority dated Jul. 10, 2019 corresponding to PCT International Application No. PCT/EP2019/059615 filed Apr. 15, 2019.
European Search Report for European Application No. 18169231.0 dated Nov. 6, 2018.
Chinese Office Action and English translation thereof dated Apr. 2, 2021.
Office Action for Chinese Patent Application No. 201980027601.2 dated Oct. 13, 2021 and English translation thereof.
Casilang, Mark, "*Resin Casting* vs. *3D Printing*; Comparing Traditional and Contemporary Manufacturing Methods"; <https://www.jameco.com/Jameco/workshop/ProductNews/casting-3d-printing-compare-contrast.html>; Jameco; Apr. 10, 2022.

\* cited by examiner

US 11,602,067 B2

BACKPLANE AND METHOD FOR PRODUCING SAME

PRIORITY STATEMENT

This application is the national phase under 35 U.S.C. § 371 of PCT International Application No. PCTEP2019/059615 which has an International filing date of Apr. 15, 2019, which designated the United States of America and which claims priority to European patent application EP18169231.0 filed Apr. 25, 2018, the entire contents of each of which are hereby incorporated by reference herein, in their entirety and for all purposes.

FIELD

Embodiments of the invention generally relate to a backplane for electrically connecting electrical components and to a method for producing a backplane of this kind. The invention further relates to a switchgear cabinet.

BACKGROUND

A backplane is understood here to mean a carrier for electrical components, which has conductor paths for electrically connecting the electrical components. Electrical components of this kind are, for example, relays, contactors, switches, control units or input/output units. Electrical components of a technical apparatus or installation are arranged in a switchgear cabinet. In conventional switchgear cabinets, electrical components are generally electrically interconnected manually by cables. In the case of a large number of electrical components, this causes a high cabling outlay.

DE102016002052A1 (Liebherr-Components Biberach GmbH) Jun. 22, 2017 discloses a switchgear cabinet and a method for producing same. The switchgear cabinet has at least one panel with a baseplate, on which electrical switching elements are arranged and are electrically interconnected. The at least one baseplate and/or at least one of the switching elements is produced via a 3D printer in a 3D printing process.

SUMMARY

At least one embodiment of the invention is directed to a backplane which is improved with regard to its functionality. Embodiments of the invention are further directed to a method for producing a backplane and an improved switchgear cabinet.

A backplane according to at least one embodiment of the invention for electrically connecting electrical components comprises a carrier plate, conductor paths arranged on and/or in the carrier plate and at least one actuator unit integrated into the carrier plate, i.e. arranged on or in the carrier plate.

A switchgear cabinet according to at least one embodiment of the invention has a backplane according to at least one embodiment of the invention. The use of a backplane according to at least one embodiment of the invention in a switchgear cabinet advantageously reduces the outlay and the costs for electrically connecting electrical components in the switchgear cabinet compared to the conventional connection of electrical components.

In the method according to at least one embodiment of the invention for producing a backplane according to at least one embodiment of the invention, the at least one actuator unit is integrated into the carrier plate by way of an additive manufacturing process. For example, the at least one actuator unit is integrated into the carrier plate by the carrier plate being produced, at least in a region surrounding the actuator unit, using a 3D printing which embeds the actuator unit into the carrier plate. A 3D printing is understood to mean a process in which a three-dimensional object is produced by way of the computer-controlled layer-by-layer application of material.

BRIEF DESCRIPTION OF THE DRAWINGS

The above-described characteristics, features and advantages of this invention, as well as the manner in which these are realized, will become more clearly and easily intelligible in connection with the following description of example embodiments which are explained in more detail with reference to the schematic drawings, in which.

Parts which correspond to one another are provided with the same reference characters in the figures.

DETAILED DESCRIPTION OF THE EXAMPLE EMBODIMENTS

Figure 1:
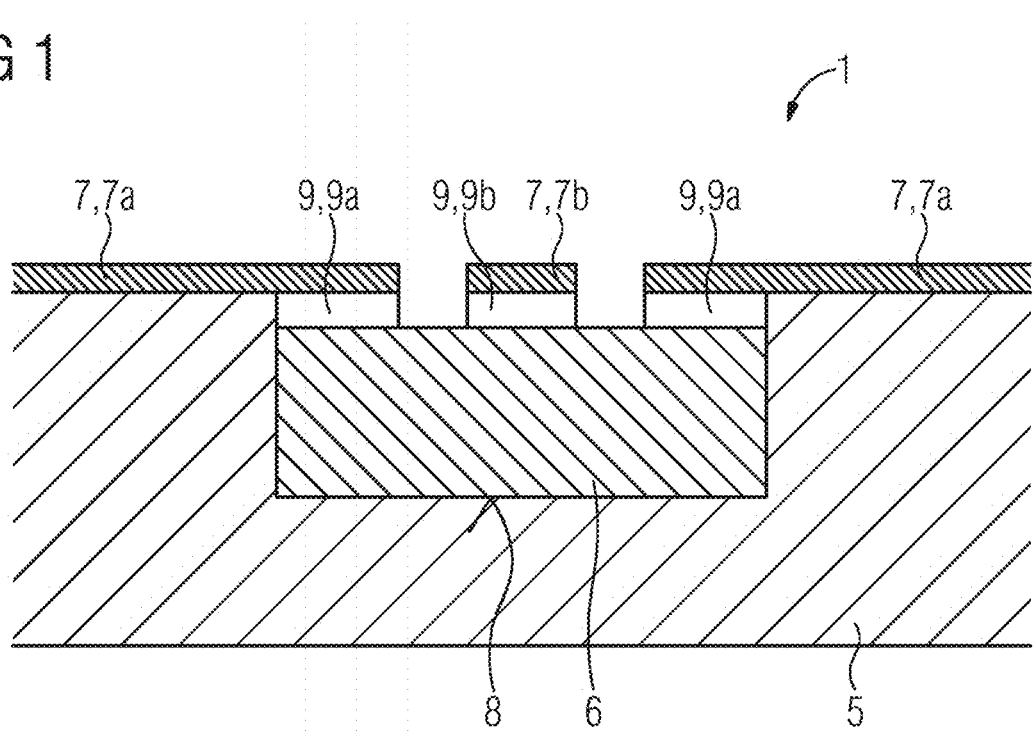
FIG. 1 shows a section of a backplane with an embedded actuator unit.

A backplane according to at least one embodiment of the invention for electrically connecting electrical components comprises a carrier plate, conductor paths arranged on and/or in the carrier plate and at least one actuator unit integrated into the carrier plate, i.e. arranged on or in the carrier plate.

A backplane according to at least one embodiment of the invention therefore, in addition to conductor paths, also has at least one actuator unit integrated into the backplane.

An actuator unit is understood to mean any kind of electrical components which perform an action. In particular, this is understood to mean switching and protection devices, i.e. all devices which can be actuated electrically in order to perform an action. In particular, actuator units convert electrical signals, e.g. commands coming from a control unit, into a mechanical movement or other physical variables, e.g. pressure or temperature. Actuator units may be considered a signal-converter-related counterpart to sensor units. They convert signals of a regulation into mostly mechanical operation, i.e. they open and close an electrical switching contact. An actuator unit may be embodied as an electromechanical device, e.g. a relay with a contact which is moved mechanically. In this case, the actuator unit can preferably be embodied as a microsystem, in particular a MEMS (MEMS=micro-electro-mechanical system). Such MEMS are manufactured in production processes which are similar to those for producing semiconductor elements, and in the same way as semiconductor elements, e.g. transistors or thyristors, can be integrated and electrically contacted directly in the carrier plate. Alternatively, an actuator unit may be embodied as an element without mechanical elements, in particular as a semiconductor element such as a thyristor for example.

An actuator unit may be an electrical device or component from the following group: electrical fuse, e.g. safety fuse or resettable fuse, in particular miniature circuit breaker; relay; contactor; motor circuit breaker; motor starter; soft starter.

An actuator unit may also be an electrical contact in an output module of a PLC, e.g. an optocoupler, a (print) relay, an electronic switching element (PLC=programmable logic controller).

An actuator unit may also be a populated printed circuit board (PCB=printed circuit board). An actuator unit may also be a populated printed circuit board with integrated output module. A printed circuit board (PCB) is a carrier for electronic parts. Here, the term "populated printed circuit board" stands for all types of electronic assembled PCBs, in which discrete and/or integrated electrical or electronic components are connected on a printed circuit board serving as a circuit carrier to form an electronic circuit. Examples of electronic components are print relays, connectors, input/output modules, control units and computing units.

An actuator unit embodied as a printed circuit board may be integrated into the carrier plate, i.e. arranged on or in the carrier plate. In this context, this may involve an integration of a conventionally populated assembled PCB into a backplane produced via AM processes (AM=additive manufacturing). This represents a combination of the respective advantages of the additive manufacturing and discrete population production processes. The high level of flexibility, including the possibilities for functional integration, is made possible by a backplane produced via AM processes, or an AM backplane for short. A conventional assembled PCB integrated into the carrier plate may be used if an assembled PCB produced via AM processes is not possible or has too many disadvantages. A conventionally populated assembled PCB is additionally suitable in particular for all components which have to be produced in large quantities and/or with a high repetition rate. Moreover, a conventional assembled PCB offers the possibility of serving as a carrier board for plug-in sockets. Contact elements attached to the assembled PCB preferably bring an assembled PCB into connection with corresponding contact elements in the AM backplane. This electrical contacting may be designed in a permanent or releasable manner. The electrical contacting may take place via screwing, clamping, plugging, soldering, pin or other contacting methods. The fastening and contacting of the assembled PCB in the AM backplane preferably takes place in such a manner that it is possible to replace the assembled PCB, e.g. in the event of a fault of a component on the board.

Advantages of electronic actuators are a very high, almost unlimited switching frequency and a very high switching speed, while electromechanical actuators are characterized by a high switching capacity and a galvanic isolation of contacts.

The integration, according to at least one embodiment of the invention, of at least one actuator unit directly into or on the carrier plate makes it possible for an individual wiring between the individual electrical components, in particular a control unit, the actuator units and the output contacts, to be able to be produced in an automated manner; an elaborate and error-prone "manual wiring", i.e. a manual electrical connecting of the various electrical components with the aid of cables, is therefore dispensed with. On the basis of the automated individual wiring, in particular by contacting an actuator unit by way of the conductor paths arranged in and/or on the carrier plate, it is possible to produce individually custom-built backplanes for each customer without great expense, i.e. to generate a backplane with lot size 1.

Through the integration of actuator units directly into the carrier plate during the additive manufacture, it is possible place the individual actuator units on an automated basis, in each case taking into consideration a minimum conductor length, a minimum influencing by EMC, a maximum heat emission, etc. (EMC=electromagnetic compatibility). In this context, individual actuator units may be integrated directly into the carrier plate and interconnected, i.e. contacted, by way of the conductors likewise integrated in the carrier plate, i.e. arranged on and/or in the carrier plate.

A switchgear cabinet according to at least one embodiment of the invention has a backplane according to at least one embodiment of the invention. The use of a backplane according to at least one embodiment of the invention in a switchgear cabinet advantageously reduces the outlay and the costs for electrically connecting electrical components in the switchgear cabinet compared to the conventional connection of electrical components.

In the method according to at least one embodiment of the invention for producing a backplane according to at least one embodiment of the invention, the at least one actuator unit is integrated into the carrier plate by way of an additive manufacturing process. For example, the at least one actuator unit is integrated into the carrier plate by the carrier plate being produced, at least in a region surrounding the actuator unit, using a 3D printing which embeds the actuator unit into the carrier plate. A 3D printing is understood to mean a process in which a three-dimensional object is produced by way of the computer-controlled layer-by-layer application of material.

Integrating an actuator unit into the carrier plate by way of an additive manufacturing process, in particular by embedding the actuator unit into the carrier plate via a 3D printing, enables an efficient population of the carrier plate with the actuator unit. In particular, an elaborate subsequent fastening of the actuator unit to the carrier plate, and fastening structures required for this, are dispensed with.

Advantageous embodiments and developments of the invention are specified in the claims. In such cases the method according to at least one embodiment of the invention can also be developed according to the dependent apparatus claims, and vice versa.

Embodiments of the invention provide for at least one actuator unit to have a current sensor for detecting an electrical current, and/or for at least one actuator unit to have a voltage sensor for detecting an electrical voltage, and/or for at least one actuator unit to have a power sensor for detecting an electrical power. The aforementioned embodiments of the invention in particular make it possible to monitor the functionality of actuator units by detecting electrical currents flowing through the actuator units, electrical voltages present at the actuator units and/or electrical powers transferred via the actuator units, and in particular to identify malfunctions and failures of actuator units. Furthermore, they make it possible, for example, to identify electrical overvoltages and overcurrents, in order to switch off electrical components if necessary and to prevent damage or destruction of the electrical components.

By way of suitable sensor units, it is possible for the functionality of actuator units and conductor paths, in particular already during the commissioning of the backplane, and/or operating conditions of the backplane to be detected and monitored. As a result, the operational safety and electrical reliability of the backplane can advantageously be increased, for example by the maintenance of the backplane being performed while taking into consideration the detected sensor signals. The sensor signals detected by a sensor unit may be made available to a higher-level application, for example. In particular, the sensor signals may be transferred into a cloud and evaluated and/or used there. For exchanging data between the backplane and the higher-level application, or between the backplane and a cloud, the backplane, in which the servers are arranged, may have an interface. The data transfer between a sensor and a unit exchanging data with the sensor may take place via a standard for data exchange, such as Profinet, Ethernet, Modbus, OPC (=Open Platform Communications).

According to a preferred embodiment of the invention, the backplane has at least one shielding element arranged on the at least one actuator unit for shielding from electrical and/or magnetic fields. By way of an action of the at least one actuator unit, e.g. by way of an opening or a closing of an electrical contact, transient processes are induced in the conductor network of the backplane, which e.g. may lead to electrical interference pulses. By way of a shielding element arranged on the at least one actuator unit, it is possible for undesirable electromagnetic interference of other components of the backplane or components in the switchgear cabinet to be reduced. By positioning the shielding element close to the source of interference, i.e. the at least one actuator unit, e.g. by way of a shielding element enveloping the actuator unit, it is possible for electromagnetic interference to be reduced in a highly effective manner.

According to a preferred embodiment of the invention, the backplane has at least one cooling element arranged on the at least one actuator unit for cooling the actuator unit. By way of an action of the at least one actuator unit, e.g. by way of an opening or a closing of an electrical contact, heat arises, e.g. due to a micro-flashover or a transfer resistance between the contacts of an electrical switch. By way of a cooling element arranged on the at least one actuator unit, it is possible for undesirable heating of other components of the backplane or components in the switchgear cabinet to be reduced. By positioning the cooling element close to the source of heat, i.e. the at least one actuator unit, e.g. by way of a cooling channel surrounding the actuator unit, it is possible for undesirable heat inputs to be reduced in a highly effective manner.

The integration of the at least one actuator unit into the carrier plate, i.e. arranging the at least one actuator unit on or in the carrier plate, may take place by way of various methods. A first option is to embed an actuator unit into the carrier plate during the additive manufacture of the backplane, wherein the electrical contacting of the respective actuator unit, i.e. the electrical connecting of the contact areas of the actuator unit to conductor paths of the backplane, takes place in an earlier or later manufacturing step during the additive manufacturing process. A subsequent replacement of the actuator unit in a non-destructive manner is no longer possible, as the actuator unit is surrounded by 3D material. According to a preferred embodiment of the invention, the carrier plate is therefore produced, at least in a region surrounding the actuator unit, using a 3D printing, so that the actuator unit is embedded into the carrier plate. According to a preferred embodiment of the invention, the at least one actuator unit is integrated into the carrier plate by the carrier plate being produced, at least in a region surrounding the actuator unit, using a 3D printing which embeds the actuator unit into the carrier plate.

Another option is to insert an actuator unit into a receptacle provided in the carrier plate, wherein it is possible to subsequently replace the respective actuator unit. According to a further preferred embodiment of the invention, the at least one actuator unit is therefore inserted into a recess of the carrier plate in a removable manner. According to a further preferred embodiment of the invention, the at least one actuator unit is integrated into the carrier plate by a recess being provided in the carrier plate, into which the at least one actuator unit is inserted.

According to a preferred embodiment of the invention, the at least one actuator unit is fixed in the recess of the carrier plate with the aid of spring elements, in particular electrically conductive spring elements. This may involve spring elements arranged on an actuator unit, e.g. metal springs, which have electrical contact areas of the actuator unit. By way of the spring pressure of the spring elements, a contact area of the actuator unit arranged on the spring element is pressed against a conductor path integrated into the carrier plate, so that a reliable electrical contact is established. In this embodiment, the spring element therefore not only serves to mechanically fix the actuator unit in the recess of the carrier plate, but also establishes a reliable electrical contacting by way of the spring effect, because tolerances present due to thermal expansion and manufacturing, for example, are compensated.

According to a preferred embodiment of the invention, the backplane has two or more actuator unit, which are arranged in a plurality of layers in or on the carrier plate. An arrangement of the actuator units which is multi-layered in relation to the plane of the carrier plate offers the advantage that vias, i.e. vertical electrical connections between conductor path planes of the carrier plate, are easier to produce. It is therefore possible to untangle complex circuitry on the backplane.

According to a preferred embodiment of the invention, the conductor paths are printed using an additive manufacturing process, for example using a 3D printing, from an electrically conductive paste, which is cured after being applied to the carrier plate and/or the at least one actuator unit. The carrier plate and the conductor network are manufactured using an additive manufacturing process, for example using 3D printing. In this context, the conductor paths are printed from an electrically conductive paste, in particular a copper, aluminum, brass or silver paste. The aforementioned embodiment of the invention takes into consideration that different configurations of components to be electrically connected also require different cross-sections and courses of the conductor paths.

When wiring an electromagnetic switching device, various conductors are connected to the switching device. The conductors to be connected comprise at least the main conductor which is switched via the switching device. Furthermore, in many cases, auxiliary conductors are connected which report the switching state of the switching device back to a higher-level controller. Furthermore, in many cases, control conductors for activating the switching device are connected.

By way of example, for power-carrying main conductors, thicker conductor paths are required than for control conductors and auxiliary conductors, and different arrangements of the components require different courses of the conductor paths. The manufacturing of the conductor paths using a 3D printing makes it possible to flexibly adapt the courses of the conductor paths to the configuration of the components to be electrically connected in each case in a simple manner. In particular, this enables a cost-effective series production of backplanes for different configurations of electrical components. 3D printing the conductor paths from an electrically conductive, curable paste is advantageous, as a paste can be applied in a simple manner and, after application, does not run and can be stabilized by curing. Copper pastes, aluminum pastes, brass pastes and silver pastes are particularly well-suited as a material for the 3D printing due to their effective electrical conductivity.

According to a preferred embodiment of the invention, at least one contact area of the at least one actuator unit, after its integration into the carrier plate, is printed with an electrically conductive paste to form conductor paths. In this context, the paste may be embodied as a solder, in particular low-melting solder, so that by way of a heating in the soldering process performed after the printing process a melting of the solder is induced and, after a subsequent cooling, a soldered connection between a printed conductor path and the at least one contact area is generated. Alternative methods for connecting the conductor paths to the contact areas are soldering with the aid of a laser beam, sintering and vibration welding.

FIG. 1 shows a section of a backplane 1, which serves to electrically connect electrical components. The backplane 1 has a carrier plate 5 produced by an AM process, here: 3D printing, e.g. made of an electrically non-conductive organic material such as plastic. The backplane 1 additionally has an actuator unit 6 embedded into the carrier plate 5, e.g. a switching device such as a semiconductor switch or a MEMS switch. The actuator unit 6 has electrical contacts 9a, 9b on its top side. Additionally, the backplane 1 has conductor paths 7, 7a, 7b, which are in each case printed from an electrically conductive paste and run on the carrier plate 5. The conductor paths 7, 7a, 7b differ: two conductor paths 7a with a larger cross-section serve as main conductors for transferring higher powers and current intensities, one conductor path 7b with a smaller cross-section serves as a control conductor 7a for transferring control signals with low current intensities. The two main conductors 7a are in each case connected to a main contact 9a, the control conductor 7b is connected to a control contact 9b; by way of a control signal transferred to the control contact 9b of the actuator unit 6 via the control conductor 7b, the actuator unit 6 can be actuated in such a way that the actuator unit 6 establishes an electrical connection between the two main conductors 7a.

During a layer-by-layer 3D printing of the carrier plate 5, the surface 8 of the actuator unit 6 lying opposite the contact areas 9 is placed on the surface of the carrier plate 5 which exists at this point in time, e.g. by a robot, and is embedded into the 3D printing material until the 3D printing touches the actuator unit 6. When the applied 3D printing material has reached the level of the contact areas 9, the conductor paths 7 are printed onto the surface of the finished carrier plate 5 as well as the contact areas 9.

In this context, the conductor paths 7, at least in the region of the contact areas 9, are printed onto the surface of the carrier plate 5 and at least one subregion of the contact areas 9 in each case in the form of a solder paste, so that by way of a heating in a reflow soldering process following the printing process a melting of the solder paste is induced and, after a subsequent cooling, a soldered electrical connection between the conductor paths 7 and the contact areas 9 is present.

Figure 2:
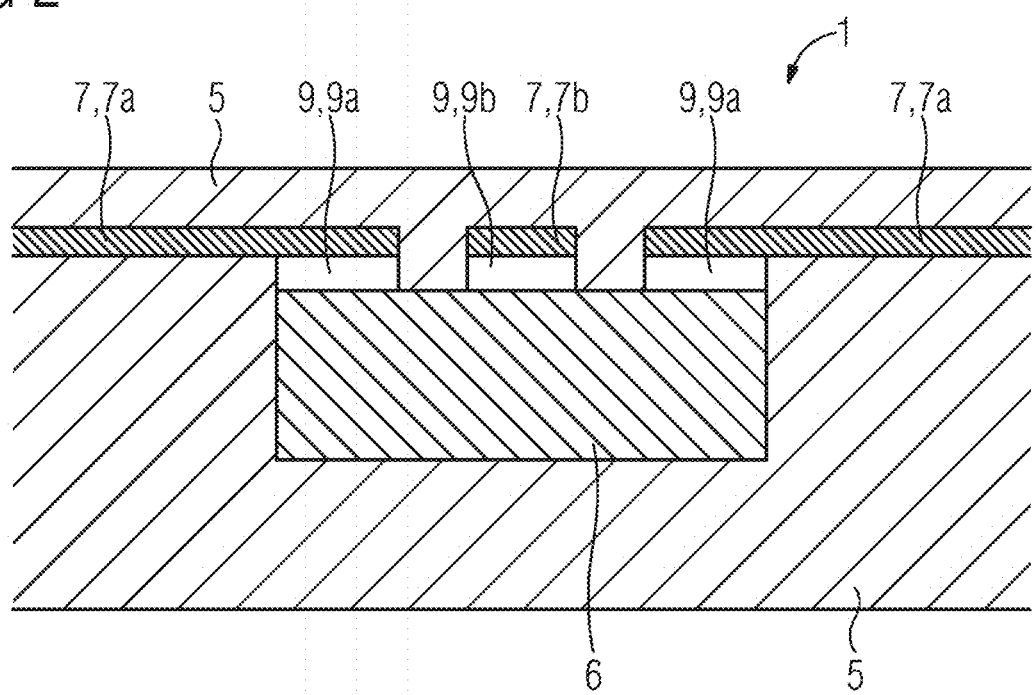
FIG. 2 shows a section of a further backplane with an embedded actuator unit.

FIG. 2 branches a section of a further backplane 1 with an embedded actuator unit 6. What is explained above in relation to FIG. 1 applies accordingly to this example embodiment. In addition to the backplane 1 shown in FIG. 1, in the backplane 1 shown in FIG. 2, following the printing of the conductor paths 7 and the electrical connection of the conductor paths 7 and the contact areas 9, an additional layer of the 3D printing material forming the carrier plate 5 has been printed onto the conductor paths 7 and the actuator unit 6, so that the conductor paths 7 and the actuator unit 6 are completely embedded into the carrier plate 5.

Figure 3:
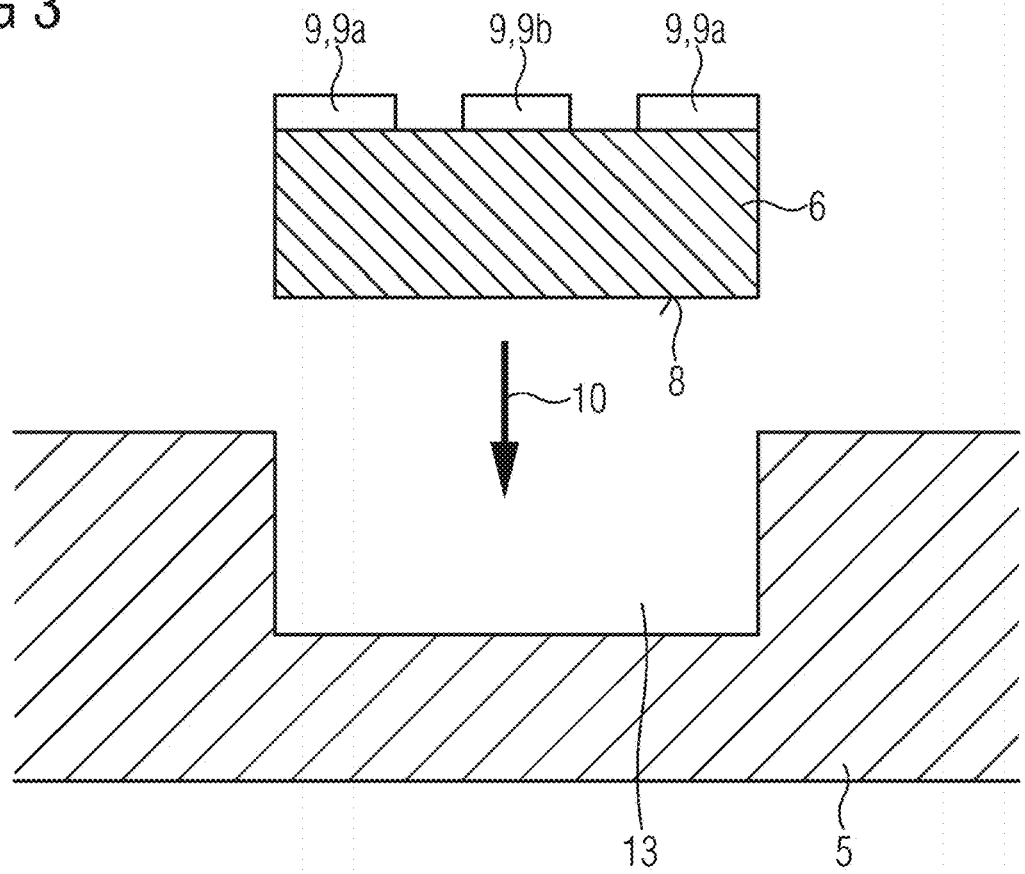
FIG. 3 shows a section of a procedure for inserting an actuator unit into a cutout of a carrier plate.

FIG. 3 shows a section of an insertion movement 10 of an actuator unit 6 into a cutout 13 of a carrier plate 5. In a first step, a carrier plate 5 is produced by way of an AM process, here: 3D printing. In this context, a volume of the printing region is kept free from 3D printing material, so that a cutout 13 forms in the carrier plate 5, of which the dimensions correspond to the outer dimensions of an actuator unit 6 to be integrated into the carrier plate 5. In a second step, the actuator unit 6 to be integrated into the carrier plate 5 is inserted into the cutout 13 of the carrier plate 5 with its surface 8 opposite the contact areas 9 first, preferably by a robot, according to an automated production of the backplane.

Figure 4:
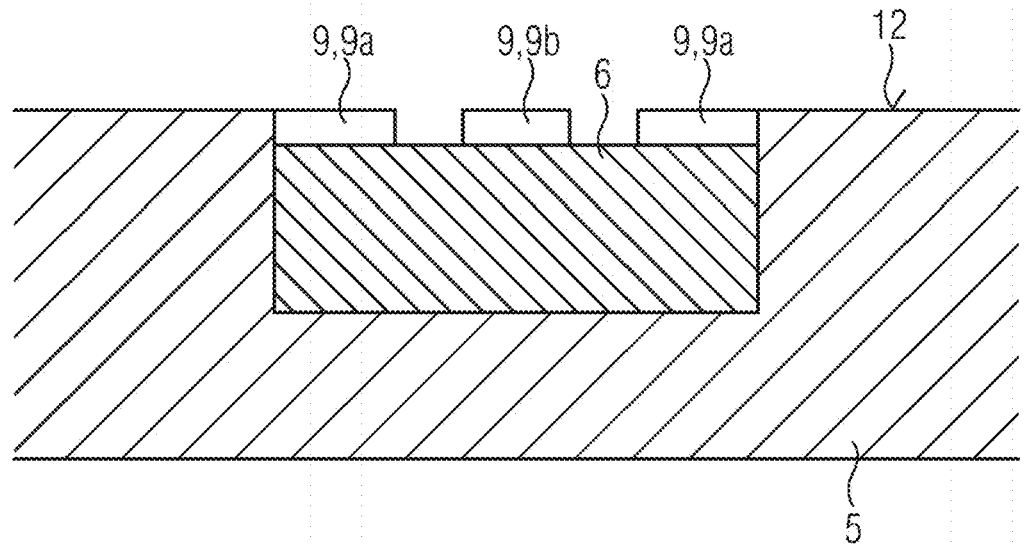
FIG. 4 shows a state following the insertion procedure shown in FIG. 3.

FIG. 4 shows a state following the insertion procedure shown in FIG. 3. The contact areas 9 of the actuator unit 6 are at the same level as the surface of the surface 12 of the carrier plate 5 in relation to a height level. In a subsequent step, conductor paths 7 can be printed onto the surface of the carrier plate 5 and the contact areas 9, in order to establish an electrical contacting of the actuator unit 6.

Figure 5:
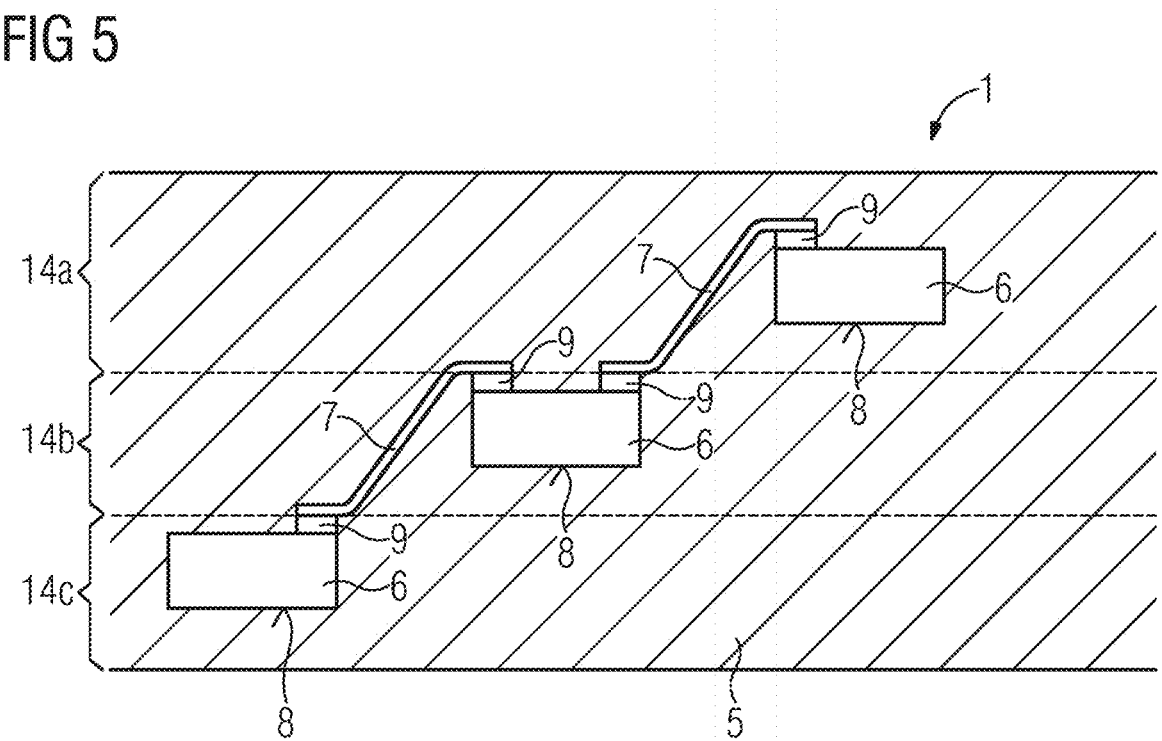
FIG. 5 shows a section of a backplane with an actuator unit arranged in multiple layers.

FIG. 5 shows a section of a backplane 1 with an actuator unit 6 arranged in multiple layers. The backplane has three layers 14a, 14b, 14c running in the plane of the carrier plate 5. An actuator unit 6 is arranged in each of the layers 14a, 14b, 14c. In this context, during a 3D printing of the carrier plate 5, the actuator units 6 are inserted in succession into what of the carrier plate 5 has been finished by that point, and when the 3D printing is continued, are surrounded by the 3D printing material of the carrier plate 5. Likewise, during the 3D printing of the carrier plate 5, conductor paths 7 which interconnect contact areas 9 of the actuator units 6 are printed by way of the 3D printing.

Figure 6:
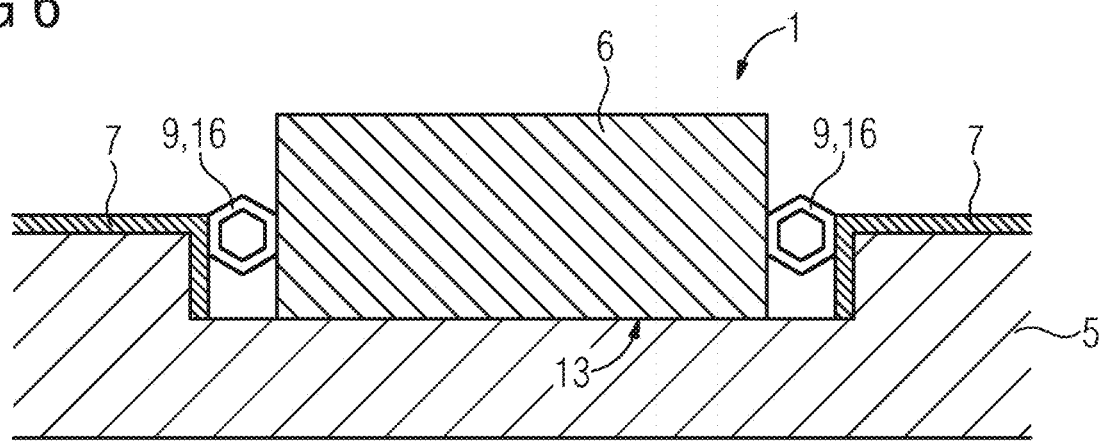
FIG. 6 shows a section of a backplane with an inserted actuator unit with spring elements.

FIG. 6 shows a section of a backplane 1 with an actuator unit 6 inserted into a recess 13 of a carrier plate 5 with spring elements 16 embodied as metal springs. The spring elements 16 serve on the one hand to mechanically fix the actuator unit 6 in the recess 13 of the carrier plate 5. On the other hand, the spring elements 16, due to their electrical conductivity, also serve to electrically connect contact areas of the actuator unit 6 and conductor paths 7 integrated into the carrier plate 5. To this end, the spring elements 16 have electrical contact areas 9 of the actuator unit 6. By way of the spring pressure of the spring elements 16, a contact area 9 of the actuator unit 6 arranged on the spring element 16 is pressed against a conductor path 7 integrated into the carrier plate 5, so that a reliable electrical contact is established. It is also possible that the spring element is an element which is produced together with the carrier plate 5 via 3D printing and is arranged on the carrier plate 5. In this embodiment, the actuator element 6 can be removed again, subsequently to the carrier plate 5, e.g. in order to change the actuator unit 6. To this end, the actuator element 6 may be extracted from above in a simple and non-destructive manner.

Figure 7:
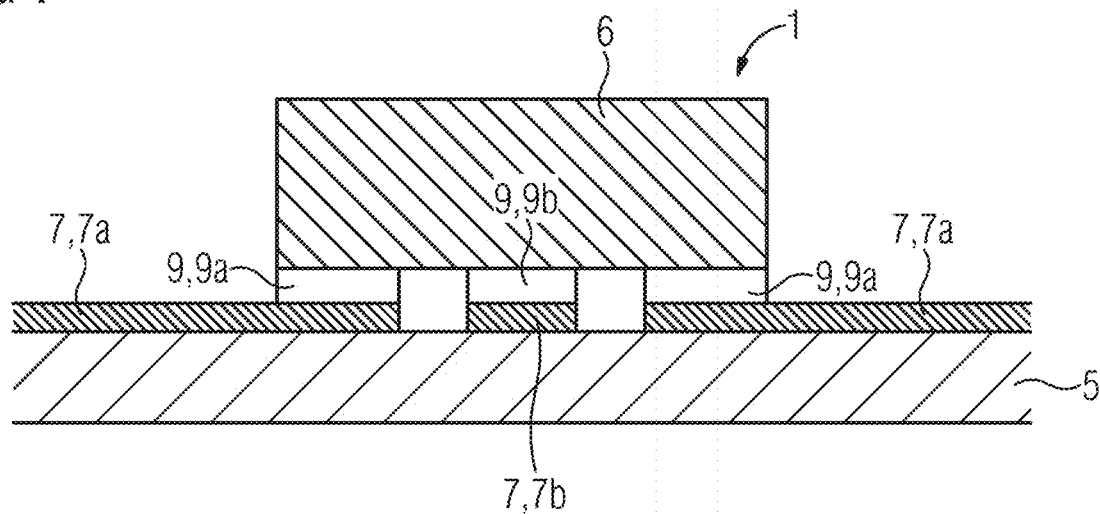
FIG. 7 shows a section of a backplane with an actuator unit placed on a carrier plate.

FIG. 7 shows a section of a backplane 1 with an actuator unit 6 placed on a carrier plate 5. Following a layer-by-layer 3D printing of the carrier plate 5, the contact areas 9 of the actuator unit 6 may be placed on the conductor paths 7 or on contacting plates of the carrier plate 5 attached to the conductor paths 7, e.g. by a robot. In a subsequent connecting process, e.g. soldering processes, soldering with the aid of a laser beam, sintering and vibration welding, the contact areas 9 can be electrically connected to the conductor paths 7 or to the contacting plates of the carrier plate 5 attached to the conductor paths 7.

Figure 8:
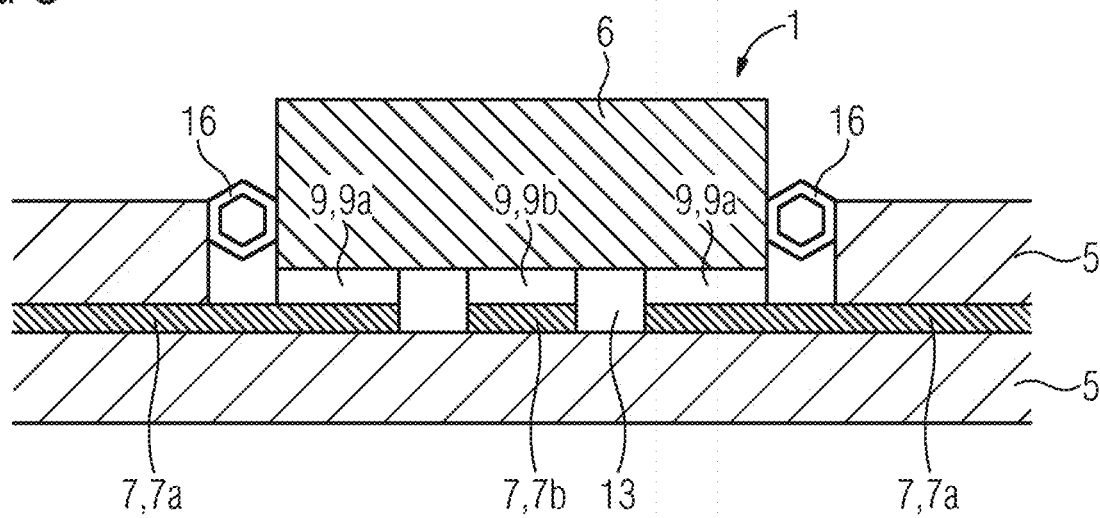
FIG. 8 shows a section of a backplane with an actuator unit inserted into a cutout of a carrier plate.

FIG. 8 branches a section of a further backplane 1 with an actuator unit 6 inserted into a cutout 13 of a carrier plate 5. What is explained above in relation to FIG. 7 applies accordingly to this example embodiment. In addition to the backplane 1 shown in FIG. 7, in the backplane 1 shown in FIG. 8, following the printing of the conductor paths 7 and the electrical connection of the conductor paths 7 or the contacting plates attached to the conductor paths 7 and the contact areas 9, an additional layer of the 3D printing material forming the carrier plate 5 has been printed onto the conductor paths 7 and the actuator unit 6. In this context, a cutout 13 in the carrier plate 5 has been produced, in which the actuator unit 6 is mechanically fixed with the aid of spring elements 16 arranged on side areas of the actuator unit 6.

Figure 9:
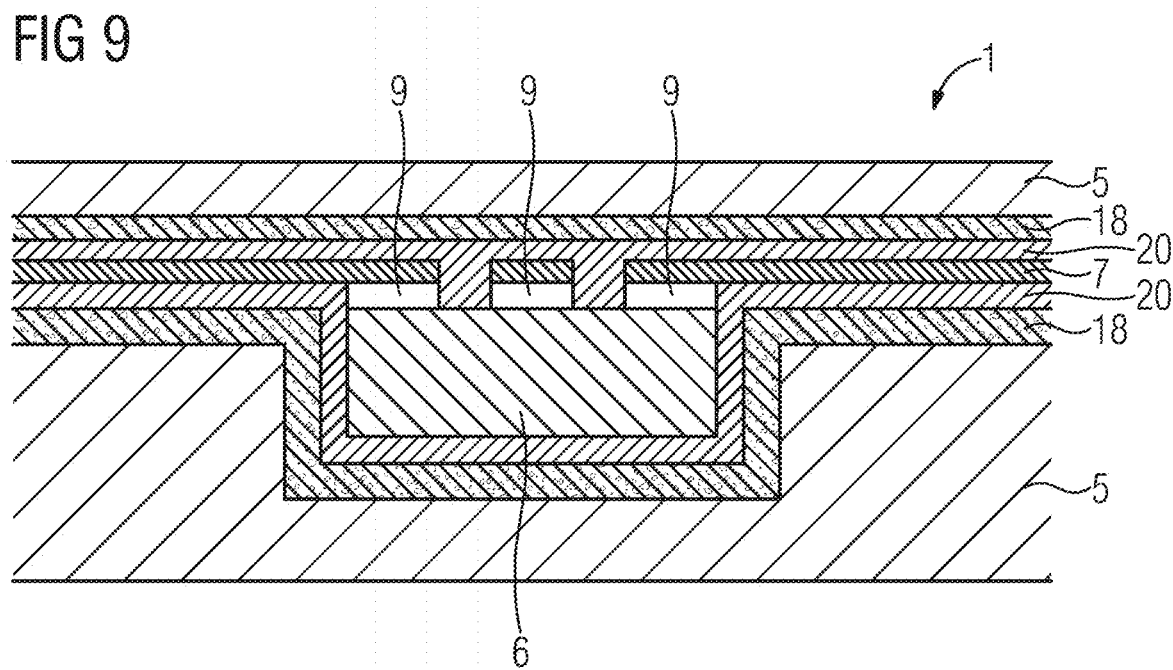
FIG. 9 shows a section of a backplane with an actuator unit shielded by a shielding element.

FIG. 9 shows a section of a backplane 1 with an actuator unit 6 embedded into a carrier plate 5, the contact areas 9 of which are electrically connected to conductor paths 7 likewise embedded into the carrier plate 5. Additionally, the backplane 1 has a shielding element 18 which is suitable for shielding from electrical and/or magnetic fields. In this context, the shielding element 18 surrounds the actuator unit 6 and the conductor paths 7.

The shielding element 18 is embodied in a tube-like manner and encases the actuator unit 6 and the electrical conductor path 7, wherein its inner surface is spaced apart from the actuator unit 6 and the electrical conductor path 7. The shielding element 18 is manufactured from an electrically conductive material and electrically shields the actuator unit 6 and the electrical conductor path 7. As an alternative or in addition, the shielding element 18 may be embodied for magnetically shielding the actuator unit 6 and the electrical conductor path 7 and to this end may have a sufficient magnetic permeability. For example, the shielding element 18 is manufactured from graphene or carbon nanotubes or from a plastic filled with carbon nanotubes.

The actuator unit 6 and the electrical conductor path 7 are enveloped by an electrically insulating insulation material 20, which fills an intermediate space between the actuator unit 6 or the electrical conductor path 7 and the shielding element 18. The insulation material 20 is, for example, an insulating varnish or a plastic and isolates the actuator unit 6 and the electrical conductor path 7 from the shielding element 18.

Figure 10:
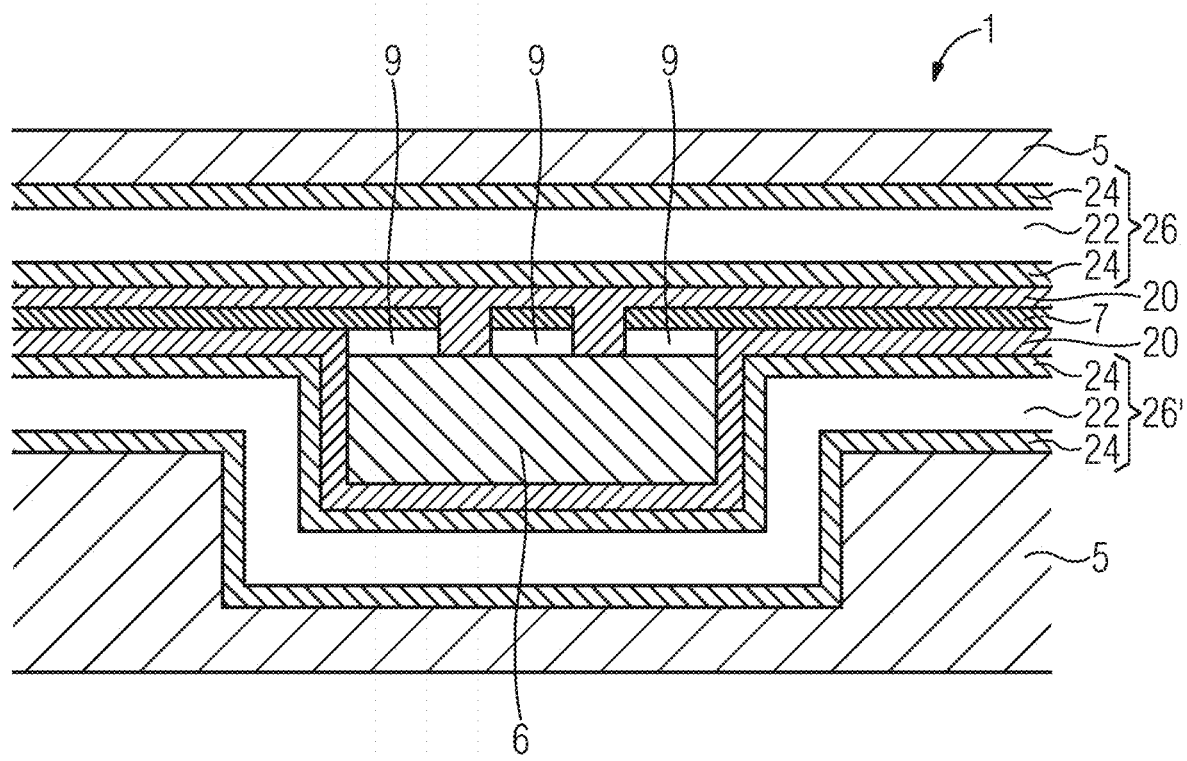
FIG. 10 shows a section of a backplane with an actuator unit cooled by a cooling element.

FIG. 10 shows a section of a backplane 1 with an actuator unit 6 embedded into a carrier plate 5, the contact areas 9 of which are electrically connected to conductor paths 7 likewise embedded into the carrier plate 5. The backplane 1 additionally has cooling elements 26, 26' suitable for cooling, each embodied as a cooling channel. Each of the cooling channels 26, 26' has a hollow space 24 surrounded by a hose-shaped channel wall 22.

The actuator unit 6 and the conductor paths 7 are coated with an insulating layer 20. Arranged on the insulating layer 20 are the two cooling channels 26, 26', which run parallel to the actuator unit 6 and the conductor paths 7 in the carrier plate 3 and are embodied to conduct a cooling fluid in the hollow space 24. The cooling fluid is a cooling liquid, for example cooling water, or a cooling gas, for example air. The end regions of the cooling channels 26, 26' in each case may have a cooling fluid port. In this context, both cooling channels 26, 26' may also have a common cooling fluid port. Alternatively, only an end region of each cooling channel 26, 26' may have a cooling fluid port and the other end regions of the cooling channels 26, 26' may be interconnected, so that the cooling channels 26, 26' form a cooling fluid circuit, in which the cooling fluid flows through a first cooling channel 26 in a first flow direction and the other cooling channel 26' in a second flow direction opposite the first flow direction.

Figure 11:
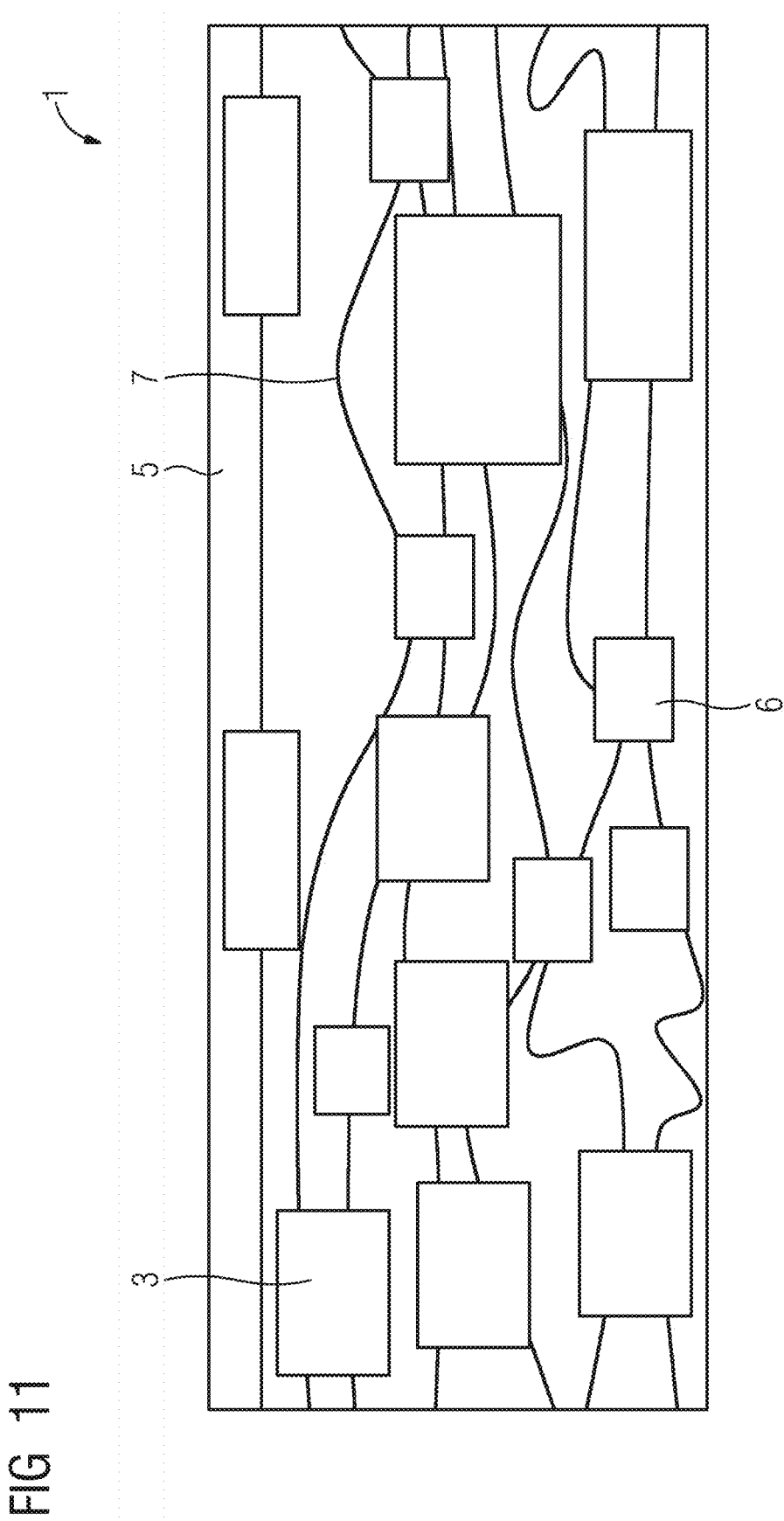
FIG. 11 shows a backplane.

FIG. 11 shows a schematic representation of a backplane 1 in a top view of the backplane 1. A plurality of electrical components 3 are arranged on the backplane 1.

An electrical component 3 may be, for example, a contactor, a switch, a control unit, an input/output unit, a soft starter or a frequency converter.

The backplane 1 has a carrier plate 5, conductor paths 7 arranged on the carrier plate 5 and actuator units 6 integrated into the carrier plate 5.

The conductor paths 7 in each case electrically interconnect electrical components 3 and/or actuator units 6.

When producing the backplane 1, the actuator units 6 are integrated into the carrier plate 5 by way of an additive manufacturing process. For example, the carrier plate 5 is produced, at least in each region surrounding an actuator unit 6, using a 3D printing which embeds the respective actuator unit 6 into the carrier plate 5.

Furthermore, when producing the backplane 1, the conductor paths 7 are applied to the carrier plate 5 using a 3D printing for example. For example, the conductor paths 7 are printed from an electrically conductive paste, in particular from a copper paste, aluminum paste, brass paste or silver paste, which is cured after being applied to the carrier plate 5.

Figure 12:
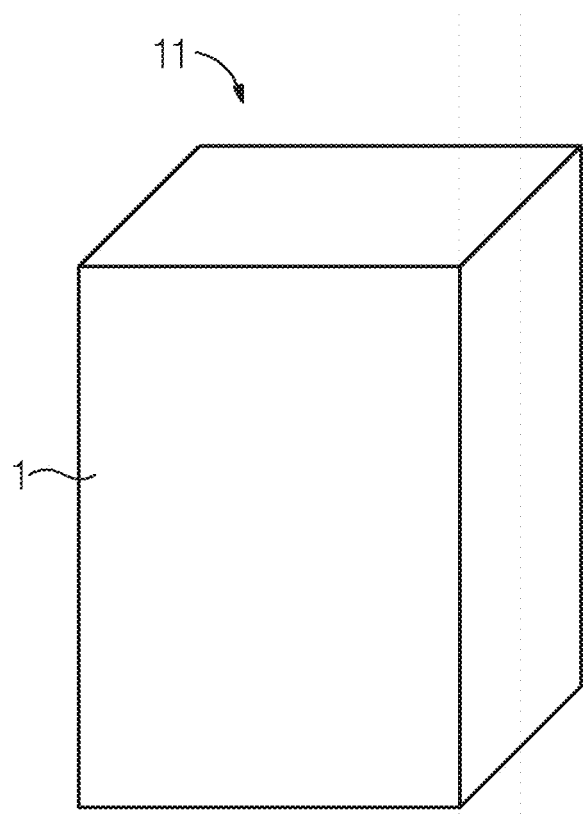
FIG. 12 shows a perspective representation of a switchgear cabinet.

FIG. 12 shows a perspective representation of a switchgear cabinet 11. The switchgear cabinet 11 has a backplane 1 described on the basis of FIG. 11, which forms a rear wall of the switchgear cabinet 11.

Figure 13:
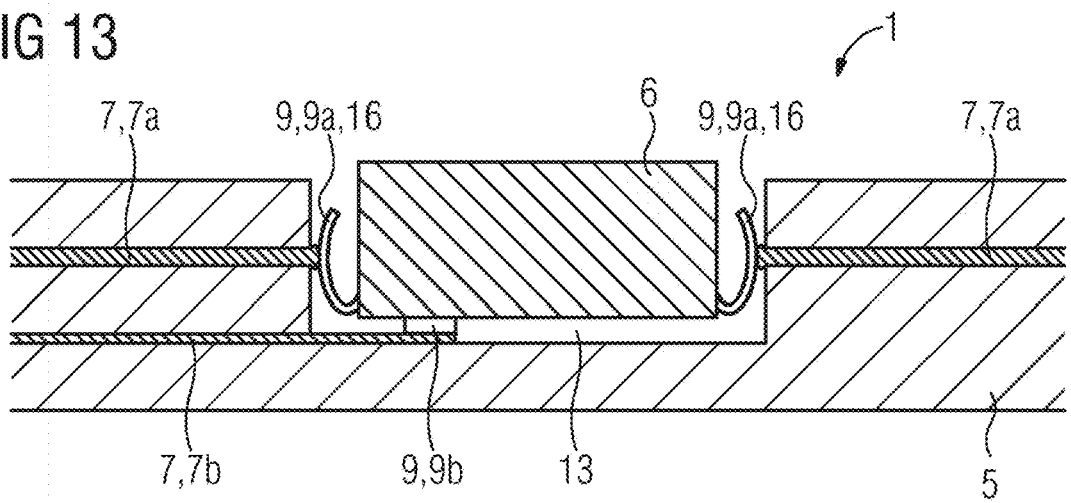
FIGS. 13 to 15 shows sections of further backplanes with an inserted actuator unit with spring elements.

FIG. 13 shows a section of a further backplane 1 with an actuator unit 6 inserted into a cutout 13 of a carrier plate 5 with spring elements 16 embodied as metal springs on the side walls. The spring elements 16 serve on the one hand to mechanically fix the actuator unit 6 in the recess 13 of the carrier plate 5. On the other hand, the spring elements 16, due to their electrical conductivity, also serve to electrically connect contact areas of the actuator unit 6 and main conductor paths 7, 7a integrated into the carrier plate 5. To this end, the spring elements 16 have electrical contact areas 9, 9a of the actuator unit 6. By way of the spring pressure of the spring elements 16, a contact area 9, 9a of the actuator unit 6 arranged on the spring element 16 is pressed against a main conductor path 7, 7a integrated into the carrier plate 5, so that a reliable electrical contact is established. During insertion into the cutout 13, the actuator unit 6 is placed on a control conductor path 7, 7b of the carrier plate 5 with a contact area 9, 9b arranged on the bottom side, e.g. by a robot.

In this embodiment, the actuator element 6 can be removed again, subsequently to the carrier plate 5, e.g. in order to change the actuator unit 6. To this end, the actuator element 6 may be extracted from above in a simple and non-destructive manner.

Figure 14:
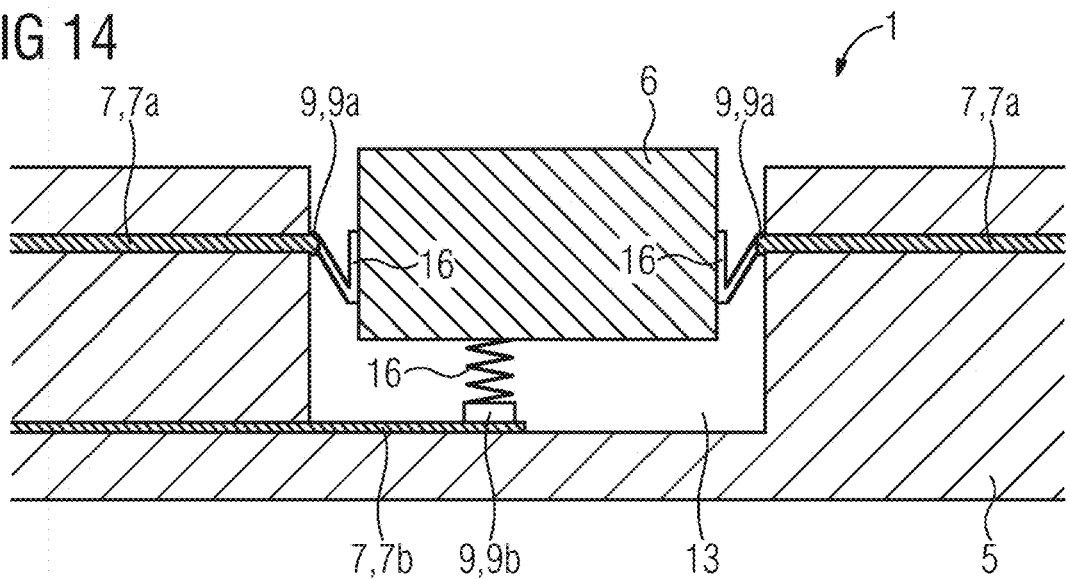

FIG. 14 shows a section of a further backplane 1 with an actuator unit 6 inserted into a cutout 13 of a carrier plate 5 with spring elements 16 embodied as metal springs on the side walls, and the bottom side. The spring elements 16 serve on the one hand to mechanically fix the actuator unit 6 in the recess 13 of the carrier plate 5. On the other hand, the spring elements 16, due to their electrical conductivity, also serve to electrically connect contact areas of the actuator unit 6 and main conductor paths 7, 7a and control conductor paths 7, 7b integrated into the carrier plate 5. To this end, the spring elements 16 have electrical contact areas 9, 9a, 9b of the actuator unit 6. By way of the spring pressure of the spring elements 16, a contact area 9, 9a, 9b of the actuator unit 6 arranged on the spring element 16 is pressed against a main conductor path 7, 7a or control conductor path 7, 7b integrated into the carrier plate 5, so that a reliable electrical contact is established. During insertion into the cutout 13, the actuator unit 6 is placed on a control conductor path 7b of the carrier plate 5 with a contact area 9, 9b arranged on the bottom side, e.g. by a robot.

In this embodiment, the actuator element 6 can be removed again, subsequently to the carrier plate 5, e.g. in order to change the actuator unit 6. To this end, the actuator element 6 may be extracted from above in a simple and non-destructive manner.

Figure 15:
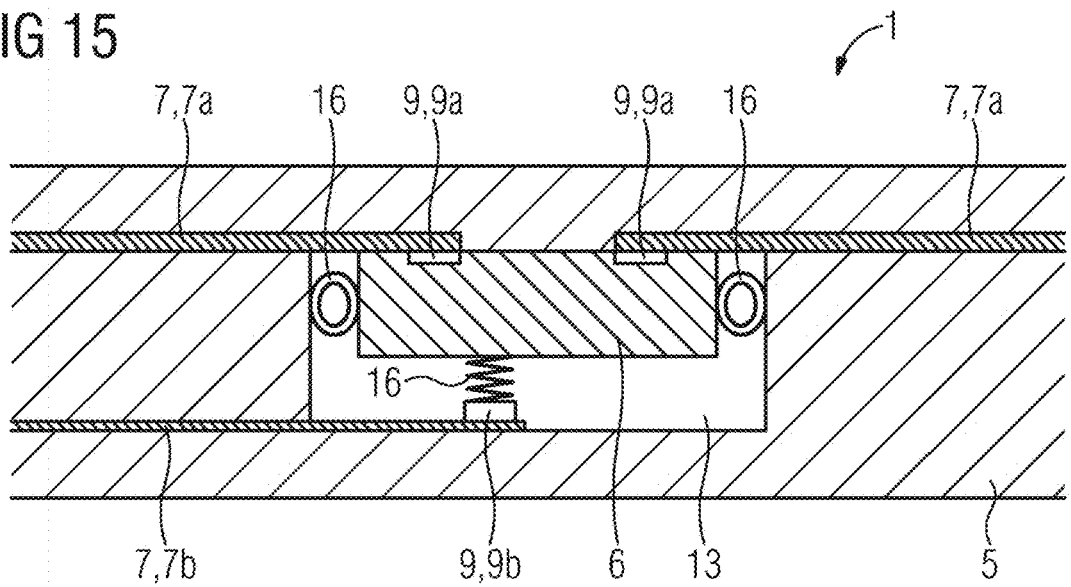

FIG. 15 shows a section of a further backplane 1 with an actuator unit 6 inserted into a cutout 13 of a carrier plate 5 with spring elements 16 embodied as metal springs on the side walls, and the bottom side. The spring elements 16 arranged on the side walls serve exclusively to mechanically fix the actuator unit 6 in the recess 13 of the carrier plate 5.

The metallic spring element 16 arranged on the bottom side serves on the one hand to mechanically fix the actuator unit 6 in the recess 13 of the carrier plate 5 and on the other hand, due to its electrical conductivity, also serves to electrically connect contact areas of the actuator unit 6 and control conductor paths 7, 7b integrated into the carrier plate 5. To this end, the metallic spring element 16 arranged on the bottom side has electrical contact areas 9, 9b of the actuator unit 6. By way of the spring pressure of the spring element 16 arranged on the bottom side, a contact area 9, 9b of the actuator unit 6 arranged on the spring element 16 is pressed against a control conductor path 7, 7b integrated into the carrier plate 5, so that a reliable electrical contact is established.

During insertion into the cutout 13, the actuator unit 6 is placed on a control conductor path 7b of the carrier plate 5 with a contact area 9, 9b arranged on the bottom side, e.g. by a robot.

After the actuator unit 6 has been inserted into the cutout 13, main conductor paths 7, 7a and an additional layer of the 3D printing material forming the carrier plate 5 are printed onto the main conductor paths 7, 7a and the actuator unit 6, so that the conductor paths 7, 7a and the actuator unit 6 are fully embedded into the carrier plate 5. In this context, the printed main conductor paths 7, 7a contact main contact areas 9, 9a arranged on the top side of the actuator unit 6.

The invention claimed is:

1. A backplane for electrically connecting electrical components, the backplane comprising:
   a carrier plate;
   conductor paths, each of the conductor paths running at least one of on the carrier plate and in the carrier plate; and
   a plurality of actuator units, arranged in the carrier plate, wherein at least one actuator unit is embodied as a microsystem, wherein the plurality of actuator units are arranged in a plurality of layers in the carrier plate, and wherein at least one conductor path is embedded between the plurality of layers and the at least one conductor path is disposed in at least two of the plurality of layers, the conductor paths being disposed between and interconnecting the plurality of actuator units, wherein the carrier plate is produced, at least in a region surrounding the plurality of actuator units, using a 3D printing, so that the at least plurality of actuator units are embedded into the carrier plate.

2. The backplane of claim 1, wherein at least one actuator unit is embodied as a populated printed circuit board.

3. The backplane of claim 2, further comprising:
   at least one shielding element, arranged on at least one actuator unit, for shielding from at least one of electrical fields and magnetic fields.

4. The backplane of claim 2, further comprising:
   at least one cooling element, arranged on at least one actuator unit for cooling the actuator unit.

5. The backplane of claim 2, wherein the carrier plate is produced, at least in a region surrounding the plurality of actuator units, using a 3D printing, so that the plurality of actuator units are embedded into the carrier plate.

6. The backplane of claim 1, further comprising:
   at least one shielding element, arranged on at least one actuator unit, for shielding from at least one of electrical fields and magnetic fields.

7. The backplane of claim 1, further comprising:
   at least one cooling element, arranged on at least one actuator unit for cooling the actuator unit.

8. The backplane of claim 1, wherein at least one actuator unit is inserted into a recess of the carrier plate in a removable manner.

9. The backplane of claim 8, wherein the at least one actuator unit is fixed in the recess of the carrier plate with the aid of spring elements.

10. The backplane of claim 9, wherein at least one actuator unit is fixed in the recess of the carrier plate with the aid of electrically conductive spring elements.

11. A switchgear cabinet comprising the backplane of claim 1.

12. The backplane of claim 1, wherein at least one actuator unit is embodied as a MEMS.

13. The backplane of claim 1, wherein at least one of the conductor paths interconnects top surfaces of at least two of the plurality of actuator units.

* * * * *